(12) United States Patent
Tripon-Canseliet et al.

(10) Patent No.: US 9,548,413 B2
(45) Date of Patent: Jan. 17, 2017

(54) MICROWAVE SIGNAL SWITCHING DEVICE, PARTICULARLY OF NANOMETRIC SIZE, AND ELECTRONIC COMPONENT INCORPORATING SUCH A DEVICE

(71) Applicants: THALES, Courbevoie (FR); UNIVERSITE DES SCIENCES ET TECHNOLOGIES DE LILLE SAIC, Villeneuve d'Ascq (FR); UNIVERSITE PARIS 6 PIERRE ET MARIE CURIE, Paris (FR)

(72) Inventors: Charlotte Tripon-Canseliet, Paris (FR); Jean Chazelas, Elancourt (FR); Didier Decoster, Roubaix (FR)

(73) Assignees: THALES, Courbevoie (FR); UNIVERSITE DES SCIENCES ET TECHNOLOGIES DE LILLE SAIC, Villeneuve d'Ascq (FR); UNIVERSITE PARIS 6 PIERRE ET MARIE CURIE, Paris (FR)

( * ) Notice: Subject to any disclaimer, the term of this patent is extended or adjusted under 35 U.S.C. 154(b) by 0 days.

(21) Appl. No.: 14/652,771

(22) PCT Filed: Dec. 20, 2013

(86) PCT No.: PCT/EP2013/077859
§ 371 (c)(1),
(2) Date: Jun. 16, 2015

(87) PCT Pub. No.: WO2014/096431
PCT Pub. Date: Jun. 26, 2014

(65) Prior Publication Data
US 2015/0349183 A1 Dec. 3, 2015

(30) Foreign Application Priority Data
Dec. 21, 2012 (FR) ...................... 12 03563

(51) Int. Cl.
*H01L 29/49* (2006.01)
*H01L 31/09* (2006.01)
*H01L 31/0224* (2006.01)

(52) U.S. Cl.
CPC .......... *H01L 31/09* (2013.01); *H01L 31/0224* (2013.01)

(58) Field of Classification Search
CPC ............................ H01L 31/09; H01L 31/0224
See application file for complete search history.

(56) References Cited

U.S. PATENT DOCUMENTS

| 2002/0113759 A1 | 8/2002 | Levine et al. |
| 2007/0108382 A1* | 5/2007 | Itsuji ..................... G01N 22/00 250/330 |

FOREIGN PATENT DOCUMENTS

| EP | 1 860 663 A2 | 11/2007 |
| FR | 2 908 569 A1 | 5/2008 |
| JP | H09-198978 A | 7/1997 |

OTHER PUBLICATIONS

Ryohei Urata et al., "Photonic A/D Conversion Using Low-Temperature-Grown GaAs MSM Switches Integrated With Si-CMOS," Journal of Lightwave Technology, vol. 21, No. 21, Dec. 2003, pp. 3104-3115, XP011106380.

* cited by examiner

*Primary Examiner* — Michael Shingleton
(74) *Attorney, Agent, or Firm* — Baker & Hostetler LLP

(57) ABSTRACT

A device for switching an electrical signal, controlled by an optical wave and having an on state and an off state, which can be inserted into a microwave transmission line, comprises a semiconductor substrate on which two conductive tracks are formed, these tracks being separated by a gap providing electrical insulation between the two tracks and each being connected to an input port and an output port, in (Continued)

the on state the electrical contact between the two tracks being established by illuminating the substrate in the region of the gap by means of the optical wave, the input impedance and the output impedance of said switching device being mismatched to the impedance of the transmission line in the off state and are matched to the impedance of the transmission line in the on state.

10 Claims, 3 Drawing Sheets

MICROWAVE SIGNAL SWITCHING DEVICE, PARTICULARLY OF NANOMETRIC SIZE, AND ELECTRONIC COMPONENT INCORPORATING SUCH A DEVICE

CROSS-REFERENCE TO RELATED APPLICATIONS

This application is a National Stage of International patent application PCT/EP2013/077859, filed on Dec. 20, 2013, which claims priority to foreign French patent application No. FR 1203563, filed on Dec. 21, 2012, the disclosures of which are incorporated by reference in their entirety.

FIELD OF THE INVENTION

The present invention relates to a device for switching microwave signals, notably of nanometric dimensions. The invention also relates to an electronic component incorporating such a device.

It applies notably in the field of analog/digital conversion for applications relating to the field of telecommunications or the field of electromagnetic detection systems. It thus applies, for example, to microwave receivers operating at frequencies corresponding to millimeter waves or to receivers with an instantaneous band of several gigahertz.

BACKGROUND

With new applications in these fields, the bandwidth requirements are increasing regularly while being accompanied by a demand to reduce costs, and therefore to simplify the RF signal reception chain.

A plurality of combined effects are accentuating the need for sampling and conversion systems for analog and digital signals.

In order to digitally process the received signals, the reception chains of these receivers need to have analog/digital conversion functions.

Thus, telecommunications require larger and larger bandwidths in order to allow the transmission of dense data streams, notably in wireless local area networks (WLAN). There may be considered to be a law for data transmission equivalent to Moore's Law, namely that the bit rate of wireless communications doubles every 18 months, rapidly exceeding a rate of 1 Gbps.

Because of the intrinsic limitations of the bandwidth available to analog/digital converters being developed, without other alternative technologies having yet been suggested, microwave reception chains require complex and expensive transposition functions.

In particular, current semiconductor-based technologies do not make it possible to provide analog/digital encoders operating above 2 to 3 GHz with a large dynamic range, often lying beyond a signal-to-noise ratio of 50 dB. It is conventional to introduce microwave mixing functions into the reception chain in order to transpose the received signals into the frequency band compatible with the input of an encoder.

When the input frequencies are very high, it is necessary to resort to a plurality of mixing stages, which significantly increases the complexity of microwave reception chains.

Optically controlled electronic devices can be used to carry out the switching or sampling functions required in order to produce, notably, converters.

In the scope of use in an analog reception system, a user generally seeks a device whose performances in terms of dynamic range, insertion losses and noise are optimized, and the optical control power of which is therefore as low as possible. In the case of a photoswitch, in particular, this leads to a device whose two optically controlled states, the on state and the off state, are very different in terms of transmission, this difference being several tens of decibels (dB). Such a switch may be defined as a device having two electrodes representing an input port and an output port, which are deposited on a photoconductive substrate, as well as an interaction region consisting of the region of the substrate which separates the two ports and which, under the effect of a light wave, ensures electrical continuity between the two ports. The control light wave is generally conveyed by means of an optical fiber to the region of the component on which it interacts (interaction region) in order to control the operation of the component. Optimization of the optical control power is obtained by using systems making it possible to focus all of the light into the interaction region, with limitations which are of the order of 10 µm for a single-mode fiber and 50 µm for a multimode fiber. The literature reports a variety of research into the production of photoswitches with illumination using a high optical power, having an ultrafast operating mode, the time involved being of the order of one picosecond.

However, devices produced to date have characteristics and performances which limit the working frequency to frequencies compatible with the best contrast between the on state and the off state, denoted by ON/OFF. Thus, current devices are limited to frequencies of the order of 1 to 2 GHz, their characteristics and performances being as follows:
 low ON/OFF contrast of the order of from 3 dB to 10 dB at a frequency of 20 GHz;
 insertion losses of the order of 30 dB;
 high optical control power, of the order of 100 mW on average.

For a given semiconductor, reduction of the optical control power requires far smaller dimensions in the illuminated region, these dimensions being for example of the order of nanometers.

SUMMARY OF THE INVENTION

It is an object of the invention notably to make it possible to produce optically controlled electronic switching devices with very small dimensions, for example nanometric dimensions, improving all the performances mentioned above, in terms of power, insertion losses and contrast. To this end, the invention relates to a device for switching an electrical signal, controlled by an optical wave and having an on state and an off state, which can be inserted into a microwave transmission line, said device comprising a semiconductor substrate on which two conductive tracks are formed, these tracks being separated by a gap providing electrical insulation between the two tracks and each being connected to an input port and an output port, in the on state the electrical contact between the two tracks being established by illuminating the substrate in the region of the gap by means of the optical wave, the input impedance and the output impedance of said switching device being mismatched to the impedance of the transmission line in the off state and are matched to the impedance of the transmission line in the on state.

In the off state, the input impedance and the output impedance are, for example, more than one kiloohm.

The width of the conductive tracks decreases, for example, from the input and output ports as far as the gap, the decrease being able to be linear. Advantageously, the tracks have for example a termination at the gap with a dimension equivalent to the width of the gap.

The structure of the device being of the coplanar type, it comprises, for example a ground plane on each side of the conductive tracks, the distance between the ground planes and the tracks remaining substantially constant between the input and output ports and the gap.

The length of the gap is for example less than 1 µm, and it may be of the order of 0.5 µm.

Another object of the invention is an electronic component incorporating a device according to the invention as described above. In particular, such a component may be a sample-and-hold circuit.

BRIEF DESCRIPTION OF THE DRAWINGS

Other characteristics and advantages of the invention will become apparent from the following description made with reference to the appended drawings, in which.

DETAILED DESCRIPTION

Figure 1:
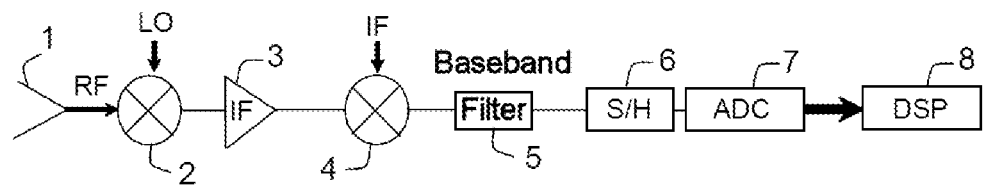
FIG. 1 represents a schematic illustration of a reception chain.

FIG. 1 schematically illustrates a conventional reception chain as used in numerous current systems. Because of the intrinsic limitations of the bandwidth available to analog/digital converters being developed, microwave reception chains require complex and expensive transposition functions in the absence of any alternative. Thus, the reception chain of FIG. 1 comprises at the output of the microwave signal reception antenna 1 a first mixer 2 bringing the frequency of the signal into an intermediate frequency band. A second mixer 4 transposes the amplified signal 3 into the baseband in order to be sampled at high frequency by a sample-and-hold circuit 6 after filtering 5, for example. The sampled signal is digitally converted by a converter 7, the digital signal being taken into account by processing means 8.

Future systems, even more so than current systems, will require the production of receivers operating either at very high frequency, several tens of GHz, or with a very wide instantaneous bandwidth, for example 20 GHz. Such receivers require very high-performance switching functions. Optically controlled switching devices capable of switching very rapidly can satisfy these operating frequencies so long as they have sufficient performance in terms of ON/OFF contrast, more than 50 dB for example. It is also necessary for them to have sufficient performance as regards the necessary optical power and the insertion losses in order to allow acceptable operation in terms of power consumption. Such switches constitute an elementary switching function for components of the reception chain, for example the sample-and-hold circuits. They may also be used to produce mixers, phase shifters and other components requiring a high-performance ultrafast elementary switching function.

Figure 2A:
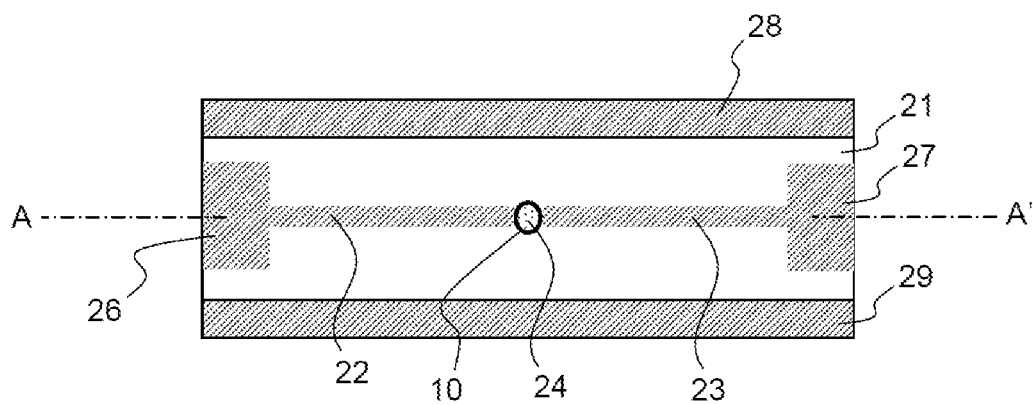
FIGS. 2a and 2b represent an example of an optically controlled switching device according to the prior art.
Figure 2B:
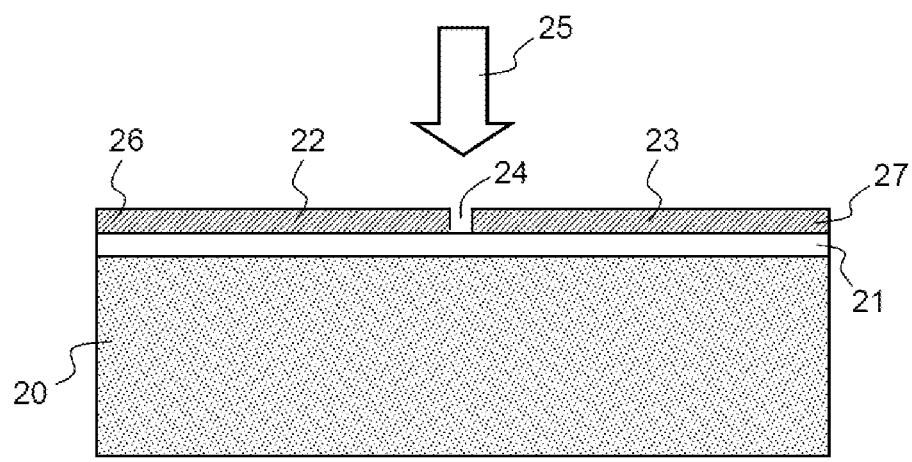

FIGS. 2a and 2b present an exemplary embodiment of an optically controlled electronic switching device according to the prior art, FIG. 2a representing a view from above and FIG. 2b representing a view in section along AA'. The device comprises a semiconductor substrate 21, on which two conductive tracks 22, 23 are placed. The semiconductor substrate comprises, for example, at least two layers. A first layer 20 consists, for example, of semi-insulating gallium arsenide (AsGa) acting as a support. In order to obtain very short response times, this first layer is supplemented on the surface with a semiconductor layer grown epitaxially at low temperature (LT AsGa). The latter layer may furthermore be doped.

The conductive tracks 22, 23 are placed in alignment and are separated by a space 24, also referred to as a gap, which does not have any metallization so that they are electrically insulated from one another. In order to fulfill the switching function, energy is supplied to the substrate by means of a light wave 25. The effect of this supply of energy is to make the substrate locally conductive in the illuminated region 10 by injection of carriers into this region, which region contains the gap 24 separating the two conductive tracks 22, 23. This region 10 is also referred to as the interaction region. Electrical continuity is thus established between these two tracks, corresponding to the on state of the switch. Conversely, if the interaction region 10 ceases to be illuminated, it thereby ceases to be conductive and the electrical continuity is interrupted, the switch then being in the off state. Typical dimensions may be as follows:

length of the gap 24=10 µm
width of a track 22, 23=10 µm
diameter of the illuminated region, interaction region 10=10 µm.

The interaction region 10 therefore substantially has the dimensions of the tracks and of the gap.

The switch furthermore comprises two input ports 26, 27, each port being connected to one track 22, 23. In practice, for example, the ports 26, 27 extend the tracks. Two conductive strips 28, 29, arranged at equal distances on either side of the conductive tracks 22, 23, are connected to a ground potential, thus forming ground planes. The switch as illustrated by FIGS. 2a and 2b is thus incorporated in a microwave line of the coplanar type. The dimensions between the central tracks 22, 23 and the peripheral ground planes 28, 29 are defined in such a way that the switch that the input or output impedance of the switch is matched to the characteristic impedances of standard microwave lines, that is to say 50 ohms or 75 ohms, as in all conventional switches. The length of the switch presented in FIG. 2 is for example of the order of 1 mm, and its width is of the order of 100 µm.

The quality of the switching is characterized notably between the contrast in the on state and the contrast in the off state, the ON/OFF contrast defined above. One object of the invention is to produce a switching device whose microwave performances are optimized insofar as they maximize this contrast, corresponding to improvement of the signal-to-noise ratio and therefore the switching quality. Furthermore, the optical power necessary for the control should preferably be minimized.

Figure 3A:
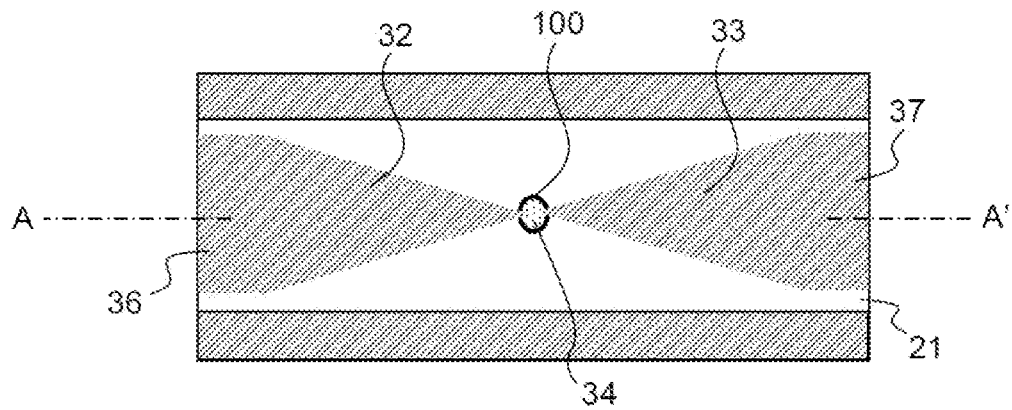
FIGS. 3a et 3b represent an example of an optically controlled switching device according to the invention.
Figure 3B:
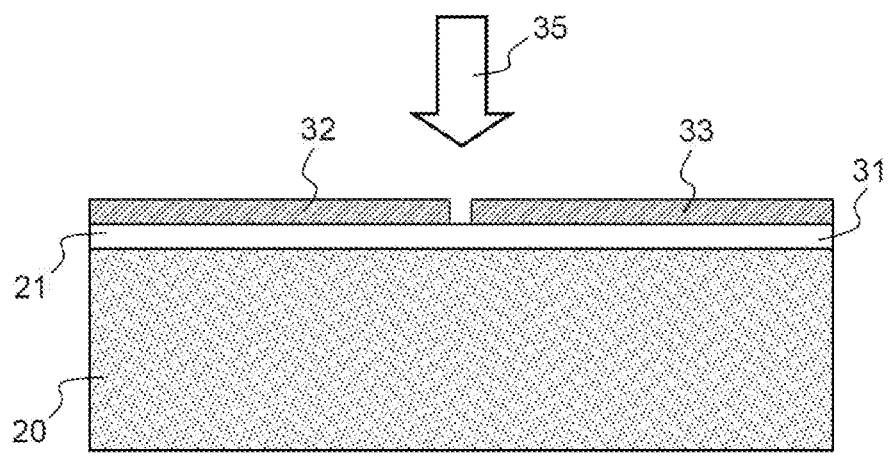

FIGS. 3a and 3b illustrate an exemplary embodiment of a switching device according to the invention. As in the case of FIGS. 2a and 2b, FIG. 3a presents a view from above and FIG. 3b presents a view in section along AA'. The device again comprises a semiconductor substrate 20, 21, for example of the type in FIGS. 2a and 2b, on which conductive tracks 32, 33 are placed. The structure of the switch is again of the coplanar type. Two ground planes 28, 29 are therefore placed on either side of the conductive tracks 32, 33.

According to the invention, these conductive tracks 32, 33 have a particular profile. Starting from the input ports 36, 37, they decrease in width until they end, for example, in a tip at the gap 34 separating these two tracks. As in the previous case, an optical beam 35 illuminates a region 100 containing this gap 34. In this exemplary embodiment, the typical dimensions may be as follows:

length of the gap 34=0.5 µm
diameter of the illuminated region, interaction region 100=1 to 2 µm
width of a conductive track 32, 33 at the gap: this is less than 1 µm.

These values show that in this exemplary embodiment the conductive tracks 32, 33 have a termination with a dimension equivalent to the length of the gap, at the gap. In other words, the width of the tracks at the gap is of the same order of magnitude as the length of the gap. The width of the tracks is, for example, substantially equal to 0.5 µm.

In order to obtain an interaction region 100 with such a small diameter, and therefore to confine the beam in such a small surface area, a means is provided for guiding and focusing the light beam 35 in the direction of this region 100.

Furthermore, according to the invention the input and output impedances of the switch are mismatched when it is in the off state. Thus, the contrast between the on state and the off state (ON/OFF) is increased. This is because the insertion losses in the off state (OFF) are increased in this case. The mismatch of the input and output impedances of the switch generates signal reflections at its input and at its output, which increases the transmission losses. These losses increase the contrast between the on state and the off state by being added to the highly resistive impedance of the interaction region. However, this increase in contrast between the on state and the off state requires that the input and output impedances of the switch be matched when it is in the on state.

The geometry of the conductive tracks 32, 33 makes it possible to match the input/output impedances of the switch to the characteristic impedances of the microwave lines to which it is connected, 50 ohms or 75 ohms for standard lines, for the on state, and to mismatch these impedances for the off state.

Thus, a switch according to the invention is such that:
the input/output impedance of the switch is mismatched to the impedance of the interrupted transmission line in the absence of optical control, corresponding to the off state;
the input/output impedance of the switch is matched to the impedance of the transmission line in the on state, and more particularly the impedance of the line is matched to the resistance created by the illumination of the interaction region 100.

During the illumination, the impedance of the interaction region changes from a few kiloohms, in the off state, to a few tens of ohms by confinement of the illumination region in the on state. This impedance then becomes compatible with the access impedance of the tracks, which is selected for the mismatch in the off state (OFF), thus reducing the signal reflections along the device. More particularly, the gap is dimensioned in terms of length and width so that the input impedance and the output impedance of the switch are matched to the characteristic impedance of the microwave line, for example to a standard microwave line having a characteristic impedance of 50 ohms or 75 ohms. In practice, it is sufficient for the input impedance and the output impedance to approximate these values, that is to say to be of the order of a few tens of ohms.

Figure 4:
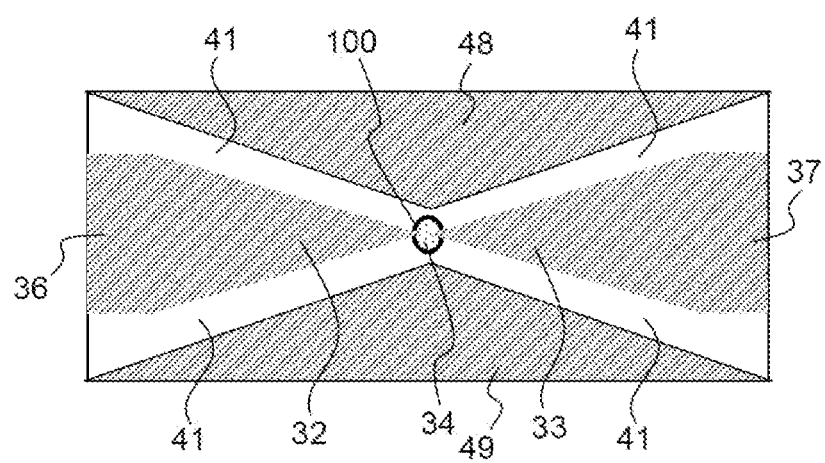
FIG. 4 represents another exemplary embodiment of a device according to the invention in a structure of the coplanar type with ground convergence.

FIG. 4 presents, by a view from above, another possible embodiment of a switch according to the invention, again in a structure of the coplanar type. In this embodiment, the ground planes 48, 49 arranged on either side of the tracks 32, 33 converge in the direction of these tracks so as to leave a space 41 of constant width, or almost constant width, between them and the tracks.

Figure 5A:
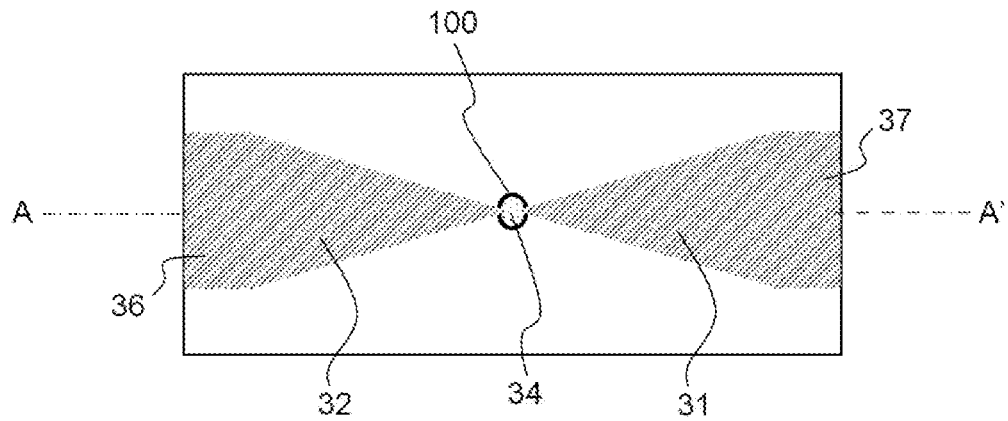
FIG. 5 represents an exemplary embodiment of a device according to the invention in a structure of the microstrip type.
Figure 5B:
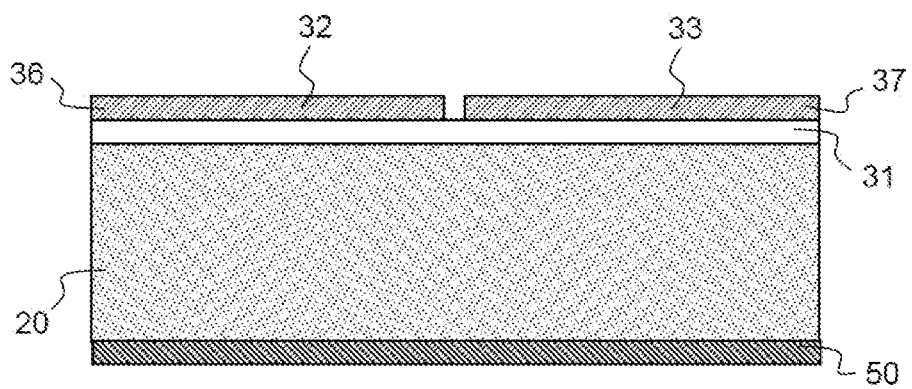

FIGS. 5a and 5b respectively present a possible embodiment of a switch according to the invention by a view from above and by a view in section along AA'. In this exemplary embodiment, the configuration is of the microstrip type, that is to say there is not a ground plane on either side of the conductive tracks 32, 33 but a ground plane 50 lying on the rear face of the semi-insulating GaAs substrate.

Figure 6:
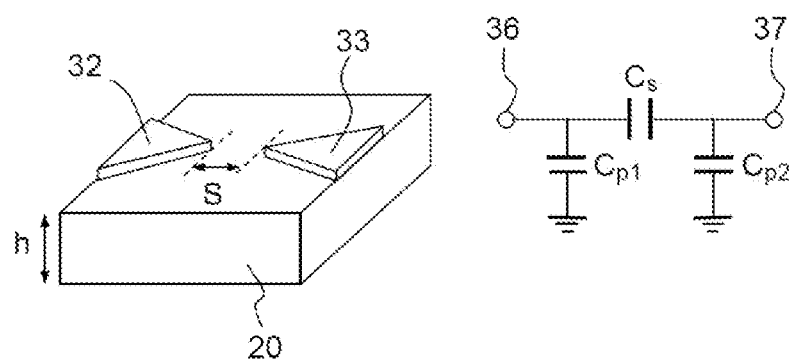
FIG. 6 is an equivalent circuit of an exemplary embodiment of a device according to the invention in the off state, illustrating the calculation of the dimensions of said device.

FIG. 6 illustrates the equivalent circuit of the switch in the off state. The equivalent circuit is composed of three capacitors Cs, Cp1, Cp2. The capacitors Cp1 and Cp2 respectively represent the capacitances of the tracks 22, 33 with respect to a ground plane. The capacitor Cs, connected between the ends of Cp1 and Cp2, represents the capacitance of the gap with a width s. The values of these capacitances depend on the various dimensions involved. They depend notably on the thickness h of the semiconductor substrate, the width s of the gap and the geometry of the tracks 32, 33. The geometry of the tracks depends notably on their pointed shape as illustrated by FIGS. 3a, 4 and 5, and notably on the length of the tip and its maximum width.

The input and output impedances of the switch in the off state are themselves dependent on its capacitances. Dimensions are therefore defined which make it possible to obtain a mismatch of the input and output impedances of the switch.

Another dimensioning parameter is the value of the input impedance of the switch in the on state. This is matched to the line. In this case, the capacitance Cs of the equivalent circuit of FIG. 6 is replaced with a resistor, which may be calculated notably as a function of the width of the gap s and the width of the flow of electric current created during the illumination of the gap region. It is thus possible to define dimensions and a geometry of the conductive tracks as a function of the constraints imposed, notably:
width of the gap less than 1 µm, for example;
matching of the input impedance in the on state; and
full mismatch in the off state.

The dimensions of the substrate and the geometry of the tracks may be calculated easily by simulation.

A device according to the invention, as described above, may advantageously be incorporated in electronic components, notably those operating with microwaves. One advantageous example is that of a sample-and-hold circuit which needs to operate in a wide instantaneous frequency band. By incorporation of one or more switching devices according to the invention, it can carry out sampling at very high frequencies while consuming little energy. Specifically, a switching device according to the invention can ensure an ON/OFF contrast of more than 30 dB at 20 GHz, for example, with an optical control power reduced to 10 mW on average.

Other electronic components requiring ultrafast switching functions may advantageously incorporate a switching device according to the invention.

The invention claimed is:

1. A device for switching an electrical signal, controlled by an optical wave and having an on state and an off state, which can be inserted into a microwave transmission line, said device comprising a semiconductor substrate on which two conductive tracks are formed, these tracks being separated by a gap providing electrical insulation between the two tracks and each being connected to an input port and an output port, in the on state an electrical contact between the two tracks being established by illuminating the substrate in a region of the gap by means of the optical wave, wherein a geometry of the conductive tracks are defined so that an input impedance an the output impedance of said switching device are mismatched to an impedance of the transmission line in the off state and are matched to the impedance of the transmission line in the on state.

2. The device as claimed in claim 1, wherein in the off state, the input impedance and the output impedance are more than one kiloohm.

3. The device as claimed in claim 1, wherein a width of the conductive tracks decreases from the input and output ports as far as the gap.

4. The device as claimed in claim 1, wherein a width of the conductive tracks decreases linearly.

5. The device as claimed in claim 3, wherein the tracks have a termination at the gap with a dimension equivalent to a width of the gap.

6. The device as claimed in claim 3, wherein a structure of the device being of a coplanar type, comprising a ground plane on each side of the conductive tracks, a distance between ground planes and the tracks remaining substantially constant between the input and output ports and the gap.

7. The device as claimed in claim 1, wherein a length of the gap is less than 1 µm.

8. The device as claimed in claim 1, wherein a length of the gap is less than 0.5 µm.

9. An electronic component, incorporating a device as claimed in claim 1.

10. The electronic component as claimed in claim 9, wherein said component fulfills a function of a sample-and-hold circuit.

* * * * *